United States Patent
Hill et al.

(10) Patent No.: US 8,497,702 B2
(45) Date of Patent: Jul. 30, 2013

(54) POWER CONTROL OF AN INTEGRATED CIRCUIT INCLUDING AN ARRAY OF INTERCONNECTED CONFIGURABLE LOGIC ELEMENTS

(75) Inventors: Stephen John Hill, Cambridge (GB); Michael Peter Muller, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/998,395

(22) PCT Filed: Aug. 20, 2009

(86) PCT No.: PCT/GB2009/002041
§ 371 (c)(1),
(2), (4) Date: Apr. 15, 2011

(87) PCT Pub. No.: WO2010/043838
PCT Pub. Date: Apr. 22, 2010

(65) Prior Publication Data
US 2011/0199118 A1    Aug. 18, 2011

(30) Foreign Application Priority Data
Oct. 17, 2008    (GB) .................................. 0819088.6

(51) Int. Cl.
*H03K 19/177*    (2006.01)
(52) U.S. Cl.
USPC ............................................................ 326/39
(58) Field of Classification Search
USPC .......................................... 326/37–47, 101
See application file for complete search history.

(56) References Cited

U.S. PATENT DOCUMENTS

| | | | | |
|---|---|---|---|---|
| 7,355,440 B1 * | 4/2008 | Santurkar et al. | ............... | 326/38 |
| 7,616,025 B1 * | 11/2009 | Irving et al. | .................... | 326/38 |
| 7,714,610 B2 * | 5/2010 | He | ................................. | 326/41 |
| 7,886,261 B1 * | 2/2011 | Irving et al. | .................. | 716/128 |
| 8,159,263 B1 * | 4/2012 | Tuan et al. | ...................... | 326/38 |
| 2003/0218480 A1 | 11/2003 | Swami et al. | | |
| 2004/0236968 A1 | 11/2004 | Hill | | |
| 2007/0164785 A1 * | 7/2007 | He | ................................. | 326/41 |
| 2008/0030224 A1 * | 2/2008 | Dasgupta | ....................... | 326/38 |

FOREIGN PATENT DOCUMENTS

EP    1 670 140    6/2006
WO    WO 2004/102623    11/2004

OTHER PUBLICATIONS

International Preliminary Report on Patentability in corresponding PCT Application PCT/GB2009/002041 mailed Apr. 28, 2011.
International Search Report for PCT/GB2009/002041, mailed Nov. 29, 2010.
Written Opinion of the International Searching Authority for PCT/GB2009/002041, mailed Nov. 29, 2010.
UK Examination Report dated May 30, 2013 in GB 0819088.6.

* cited by examiner

*Primary Examiner* — Thienvu Tran
(74) *Attorney, Agent, or Firm* — Nixon & Vanderhye P.C.

(57) ABSTRACT

An integrated circuit (8) comprising an array (10) of interconnected configurable logic elements (12), such as an FPGA array, is provided. The logic elements are used to form a power controller (14) which separately controls the power state of different regions of the array. Each region of the array contains one or more logic elements. Each region has a corresponding region controller (16) responsive to one or more power signals generated by the power controller to switch that region into the requested power state.

24 Claims, 6 Drawing Sheets

POWER CONTROL OF AN INTEGRATED CIRCUIT INCLUDING AN ARRAY OF INTERCONNECTED CONFIGURABLE LOGIC ELEMENTS

This application is the U.S. national phase of International Application No. PCT/GB2009/002041, filed 20 Aug. 2009, which designated the U.S. and claims priority to GB Application No. 0819088.6, filed 17 Oct. 2008, the entire contents of each of which are hereby incorporated by reference.

This invention relates to the field of integrated circuits. More particularly, this invention relates to the field of integrated circuits comprising an array of interconnected configurable logic elements (e.g. field programmable gate array integrated circuits) and the power state control of such integrated circuits.

It is known to provide integrated circuits comprising an array or other regular structure of interconnected configurable logic elements. Field programmable gate array integrated circuits are one example of this type of integrated circuit. These integrated circuits are useful for a variety of different purposes. One example use is for emulating an integrated circuit design before that integrated circuit design is manufactured. Another use is providing an integrated circuit with a desired functionality without having to manufacture a specific integrated circuit to provide that functionality.

As circuit densities increase, it is becoming increasingly desirable to take steps to mitigate the power consumed within an integrated circuit. It is known to divide an integrated circuit into domains which can be separately powered-up and powered-down and clocked at different frequencies. These integrated circuits are normally non-configurable integrated circuits, such as system-on-chip integrated circuits. Within the field of integrated circuits having an array of interconnected configurable logic elements, such as field programmable gate array integrated circuits, it is known to drive different portions of the array of configurable logic elements with different voltages under control of an external voltage controller circuit. The designer/user of the integrated circuit including the array of interconnected configurable logic elements decides which regions of the array require driving and which regions may not be driven for power saving reasons (e.g. MPEG decode hardware may not be needed if media processing is not being performed or a floating point unit may not be needed at a given time—this control could also be used at a finer grain with smaller portions of design being powered down if not needed). This provides a mechanism for reducing the power consumed by such an integrated circuit.

Viewed from one aspect the present invention provides an integrated circuit comprising: an array of interconnected configurable processing logic, each logic element performing data processing controlled by a configuration stored in said logic element; and a power controller formed of one or more of said logic elements configured to serve as said power controller and generating one or more power control signals; wherein said array contains one or more regions each containing one or more logic elements; and each region having a corresponding region controller responsive to at least one of said one or more power control signals to switch logic elements within said region between a plurality of different power states.

The power controller which generates the power control signals is formed by one or more of the logic elements within the array permitting considerable flexibility in the form and function of the power controller (there may be more than one power controller). The integrated circuit may contain multiple power controllers. The power controller can have functionality matched to the particular configuration of the array. Furthermore, an integrated circuit being emulated may include a power controller and this power controller and its action can be emulated by the array since each of the regions includes a region controller responsive to the one or more power control signals generated by the power controller within the array to switch the logic elements within different regions between different power states. The integrated circuit may contain many other elements, e.g. the array may be part of a system-on-chip integrated circuit. Except in cases where one power region exists per configurable logic element the design tool that maps logic onto the configurable logic fabric takes into account power regions when allocating elements. This is likely to have a utilization cost in return for the power saving.

It will be appreciated that the different power states could take a wide variety of different forms. One arrangement which provides a good balance between power saving and performance is where said plurality of different power states include: a powered state; and a state-retention state in which a memory within a logic element storing configuration for said logic element and storage circuits storing sequential circuit state for processing performed by said array respectively retain said configuration and said sequential circuit state at least when returning to a powered state and data processing circuits within said logic element are unpowered.

Entry into the state-retention state may be triggered by a control signal generated within the region itself. The data processing circuits that are unpowered during the state-retention state are combinatorial logic circuits. Balloon latches may be used to store the sequential circuit state.

The different power states could also relate to other forms of the provision of the supply voltage to the logic elements within a region or different types of clocking applied to the logic elements within a region (different clocking alters the power consumption of a region) or combinations of the above. As an example, the different power states may include at least two of:

an unpowered state;

a configuration-retention state in which a memory within a logic element storing configuration for the logic element retains the configuration at least when returning to a powered state from said configuration-retention state and data processing circuits within said logic element are unpowered;

a powered state;

an unclocked state in which a clock signal input to a logic element is stopped;

a clocked state in which a clock signal input to a logic element is clocked at a full rate of a clock signal input to said array;

a divided-clock state in which a clock signal input to a logic element is clocked at rate divided for a full rate of a clock signal input to said array; and a selected clock state in which a clock signal input to a logic element is clocked with a selected one of a plurality of asynchronous clock signals input to said array.

Another alternative is that the different power states could relate to different magnitudes of supply voltage being supplied to the logic elements within a region so as to provide voltage scaling for different regions.

While it will be appreciated that in some embodiments a region for which power control switching is performed may contain only a single logic element, the overhead associated with the present technique is reduced when each of the regions include a plurality logic elements. It may be that different numbers of logic elements are present within different regions. Some of the logic elements may be large, e.g. a large RAM or multiplier logic element, and accordingly some regions may only contain a single such large logic element.

The region controller may form part of one or more logic elements within a region with the logic element concerned also providing other functionality. Another possibility is that the region controller is provided by a dedicated logic element, such as a macro circuit, within a region on the edge of the region or elsewhere on the array.

In embodiments where the clocking is controlled to change the power state, the clock signal input to the array may be distributed through the array via a clock tree comprising separate clock tree branches supplying respective ones of the plurality of regions. In this context, a region controller for a region can be provided in the form of a circuit which gates a clock signal propagating through the clock tree to a clock tree branch of the controlled region.

It will be appreciated that a region in respect of which the power controller is able to control the power state can include logic elements which are performing significantly different functions within the overall integrated circuit. It may be that some of these logic elements can be powered down a particular time, whereas other logic elements within the same region require to remain powered. A simple approach when mapping a complex system such as a system-on-chip design with power-regions that can be powered down at different times is to not allow logic from more than one design's power region to be mapped into any power-region in the fabric. However, this can lead to unused configurable logic elements. In order to deal with this a different approach is taken in which the power controller is responsive to the power requirements of the logic elements within a region to generate a power control signal matched to the highest power state currently required by any of the logic elements within a region. Thus, for example, while at least some logic elements within a region require to be powered, the whole region will remain powered. A region can also act to generate a power requirement signal which is supplied to the power controller and indicates the highest power requirements of any of the logic elements within that region.

It will be appreciated that such arrays of interconnected configurable logic elements typically include configurable interconnect circuitry for routing signals through the array. This configurable interconnect circuitry will accordingly route through the regions into which the array is notionally divided for power control purposes. In order to ensure continuity of communication across the array such configurable interconnect circuitry is formed so as to continue to provide communication through a region irrespective of the current power state of that region, e.g. if the region controller is inside the region then the interconnect circuitry should remain operational so that a power-up command can be sent to the regional controller. Thus, signals may pass across a region even if that region is powered down. The power states may include states in which this configurable interconnect circuitry is operating or not operating.

The region controller may be formed as a switching circuit responsive to a signal input to an associated logic element.

The integrated circuit may be used to provide specific functionality when it is not justified to manufacture a bespoke integrated circuit to provide that functionality. In other embodiments, the integrated circuit may be used so that the array is configured to emulate a data processing apparatus which has a plurality of power states and with the power controller emulating a power controller of the data processing apparatus which is being emulated. Thus, the emulation is also able to encompass the emulation of the power control mechanisms.

Viewed from another aspect the present invention provides array means of interconnected configurable logic element means, each logic element means performing data processing controlled by a configuration stored in said logic element means; and power controller means formed of one or more of said logic element means configured to serve as said power controller means and generating one or more power control signals; wherein said array means is divided in to a plurality of regions each containing one or more logic element means; and each region having a corresponding region controller means responsive to at least one of said one or more power control signals to switch logic element means within said region between a plurality of different power states.

Viewed from a further aspect the present invention provides a method of operating an integrated circuit having an array of interconnected configurable logic elements, each logic element performing data processing controlled by a configuration stored in said logic element, said array being divided in to a plurality of regions each containing one or more logic elements, said method comprising the steps of: configuring one or more of said logic elements to serve as a power controller; generating one or more power control signals with said power controller; in response to at least one of said one or more power control signals, switching logic elements within a region between a plurality of different power states.

Embodiments of the invention will now be described, by way of example only, with reference to the accompanying drawings in which:

FIG. 1 schematically illustrates a prior art integrated circuit including a field programmable gate array (FPGA);

FIG. 2 schematically illustrates an integrated circuit including a FPGA which is divided into regions for which the power supply voltages are separately controlled;

Figure 5:
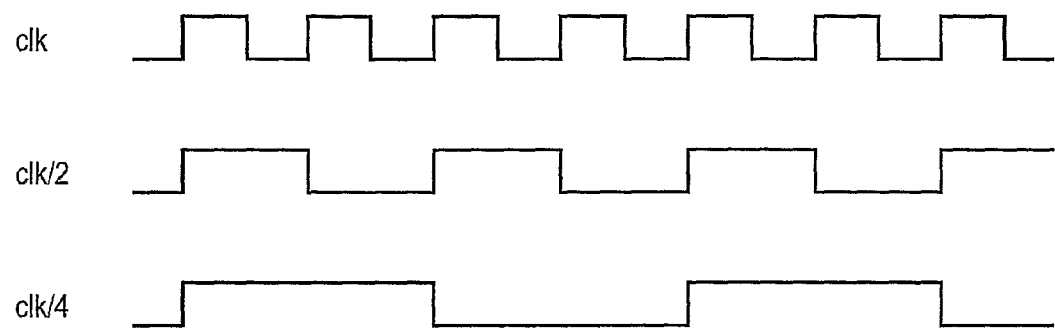
Figure 6:
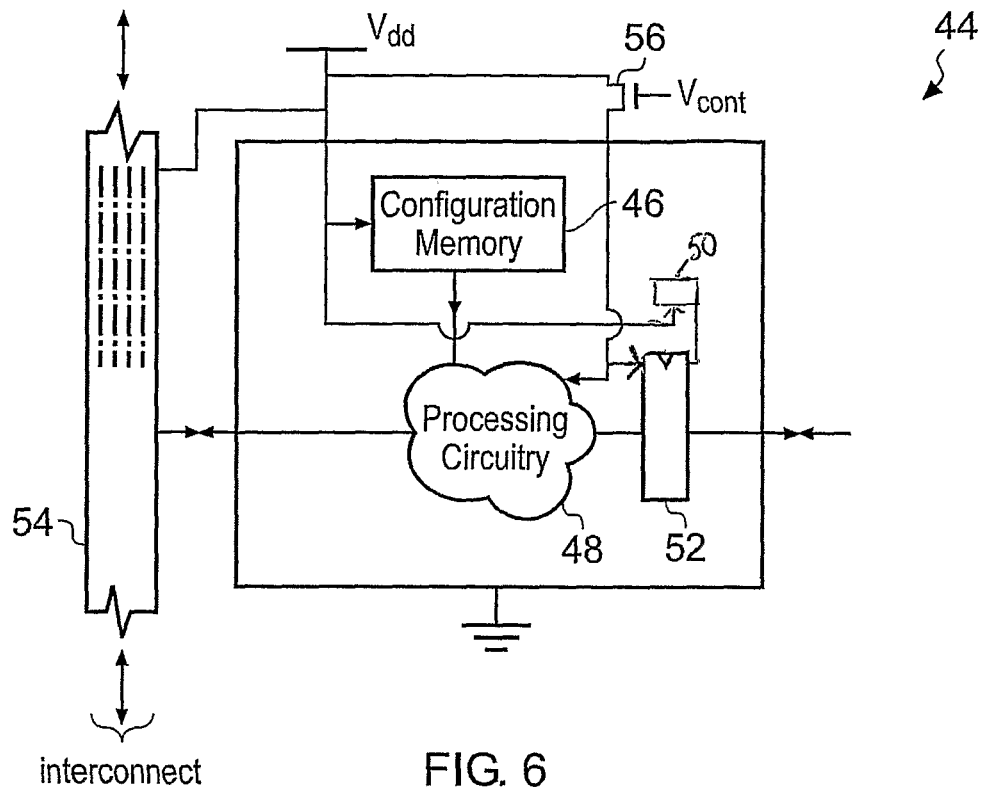
Figure 7:
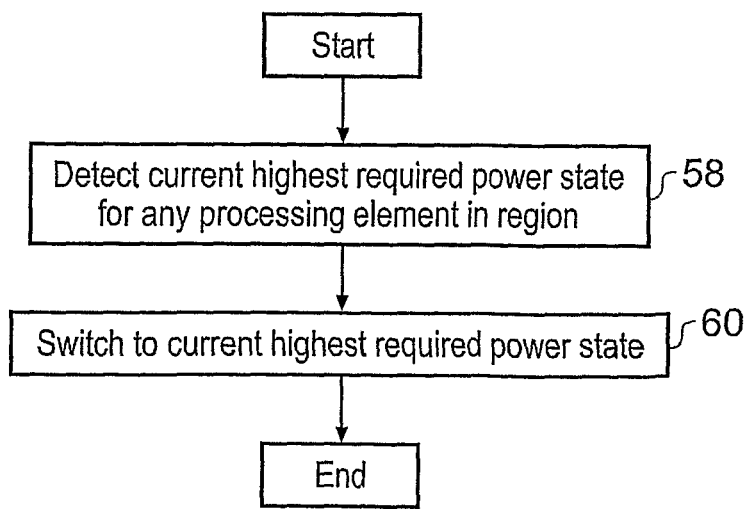

FIG. 5 schematically illustrates clock signal control which may be used to place the regions into different power states;

FIG. 6 schematically illustrates an example logic element in which different portions of the logic element are selectively disconnected from the supply voltage; and FIG. 7 is a flow diagram illustrating how the power state for a given region within an array may be determined.

Figure 1:
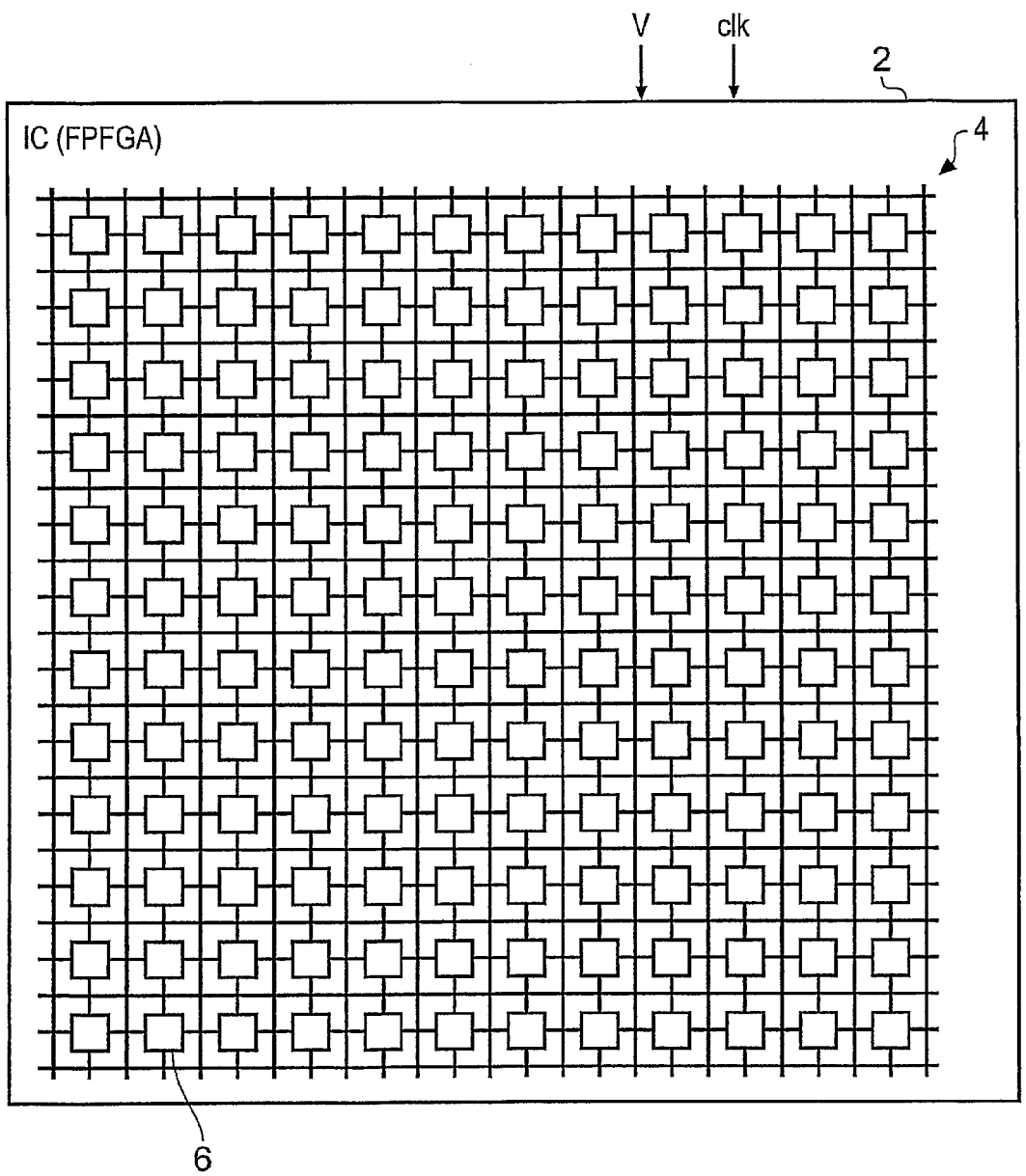

FIG. 1 schematically illustrates a known type of integrated circuit being a field programmable gate array (FPGA) integrated circuit 2. This integrated circuit 2 includes an array 4 of individual logic elements 6 which are interconnected. These logic elements 6 provide configurable logic building blocks from which desired functionality may be provided by appropriate configuration of those logic elements 6. The interconnect logic between the logic elements 6 is also configurable as part of the configuration of the integrated circuit 2. Such FPGA integrated circuits 2 will be familiar to those in this technical field and the configuration of the individual logic element 6 and the interconnect logic is in itself well known. Accordingly, the manner in which a data processing circuit may be provided or emulated using such a FPGA integrated circuit 2 will not be described further herein.

It will be noted in FIG. 1 that the integrated circuit 2 is provided with a supply voltage V and an input clock signals clk. The supply voltage V is typically used to supply power to all of the logic elements 6 within the array 4. The clock signals clk is distributed throughout the array 4 and used as required by the individual logic element 6.

Figure 2:
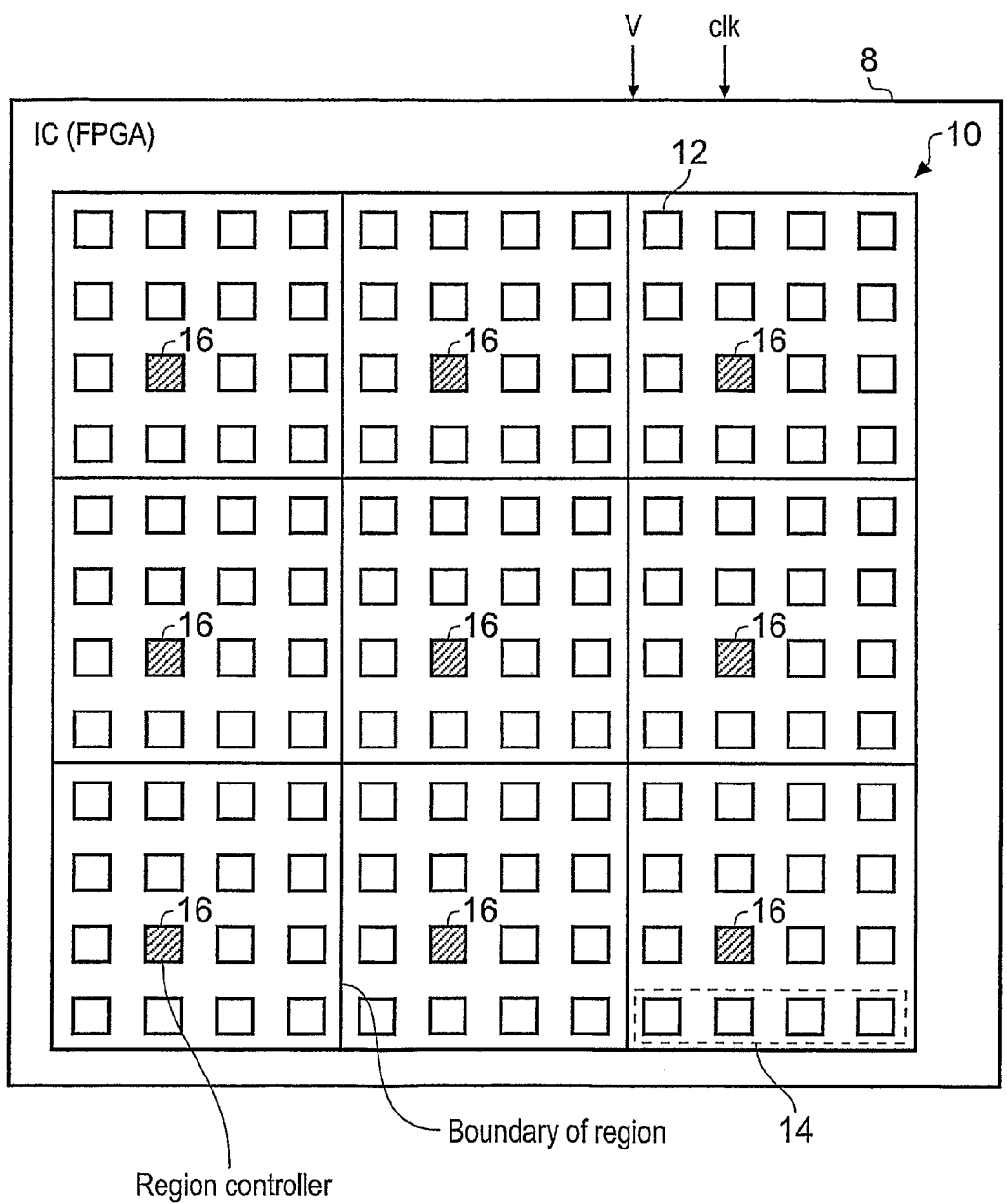

FIG. 2 schematically illustrates an integrated circuit 8 including an array 10 of interconnected configurable logic elements 12. The array 10 is divided into nine regions each containing a 4-by-4 sub-array of logic elements 12. It will be appreciated that in practice the array 10 may contain many more regions and each region may contain many more logic elements 12. It is also possible in some embodiments that an individual logic element 12 may correspond to an individual region, such that each region contains a single logic element 12. This would provide a fine-grained degree of power state control at the expense of increased control complexity and control routing overhead. The region could also include the whole FPGA array 10.

FIG. 2 shows one input supply voltage V. A suitable way to provide multiple voltages within the integrated circuit 2 is to have multiple input voltages V supplied in to the integrated circuit 2 and distributed around the integrated circuit.

Illustrated in FIG. 2 is a portion of the array 10 (bounded by a dashed line) within which the logic elements 12 are configured to serve as a power controller 14. This power controller 14 serves to generate one or more power control signals which are routed to respective regions within the array 10 to control the power state of those regions. More specifically, each region contains a region controller 16 which receives the one or more control signals from the power controller 14 and places that region into a corresponding power state. These power states may take a variety of different forms. The regions may be switched between being powered with the full supply voltage V or being unpowered, in which case they lose both their configuration and any sequential circuit state they currently contain. It is also possible to provide further supply voltage power states including states in which configuration is maintained whilst the remainder of the circuits within a logic element 12 are powered down. This can be considered a configuration-retaining state. In another possible supply voltage power state both the configuration and the sequential circuit state is maintained (e.g. the configuration memory remains powered and any latches holding sequential circuit state remain powered whilst the other circuits (e.g. data processing circuits such as combinatorial logic circuits) within the logic element 12 are unpowered). This may be considered a state-retaining power state. Entry in to the state-retaining state may be triggered by the region being placed into the state-retaining state, e.g. a counter within that region may trigger entry into the power-saving state until woken by an external event. Various other possibilities being a mixture of the above, or with different portions of the logic element 12 or circuits within the region being powered down, may also be envisaged and are encompassed in the present techniques.

It is convenient that while the logic elements 12 within a region are powered down, the configurable interconnect circuitry should remain powered such that signals propagating through the region concerned continue to so propagate as they may be required by other regions within the array 10 which are still powered. The power controller 14 (which could also be in the form of a macro circuit) can emulate a power controller which is part of the overall data processing systems being emulated by the integrated circuit 8. Alternatively, the integrated circuit 8 may be being used to provide some functionality which is not itself an emulation of any other data processing circuit and for which it is desirable to provide a power controller 14. The power controller 14 can generate the one or more power control signals in response to the detected behaviour and/or state of the circuits within the array 10 indicating the current processing requirements. Thus, it may be that the power controller 14 is responsive to signals which indicate that a particular piece of functionality is not at present being used and accordingly the logic elements 12 which provide that functionality may be powered down so as to reduce the overall power consumption heat generation, or for other reasons, such as a region itself being configured to power-down when a certain state is reached (e.g. a counter value reaching a predetermined value). It is also possible that the power controller 14 can provide voltage scaling whereby the power controller 14 detects that a particular portion of the logic elements 12 require high performance operation and accordingly the regions containing those logic elements are supplied with a higher supply voltage than other regions where high performance is not currently required.

Figure 3:
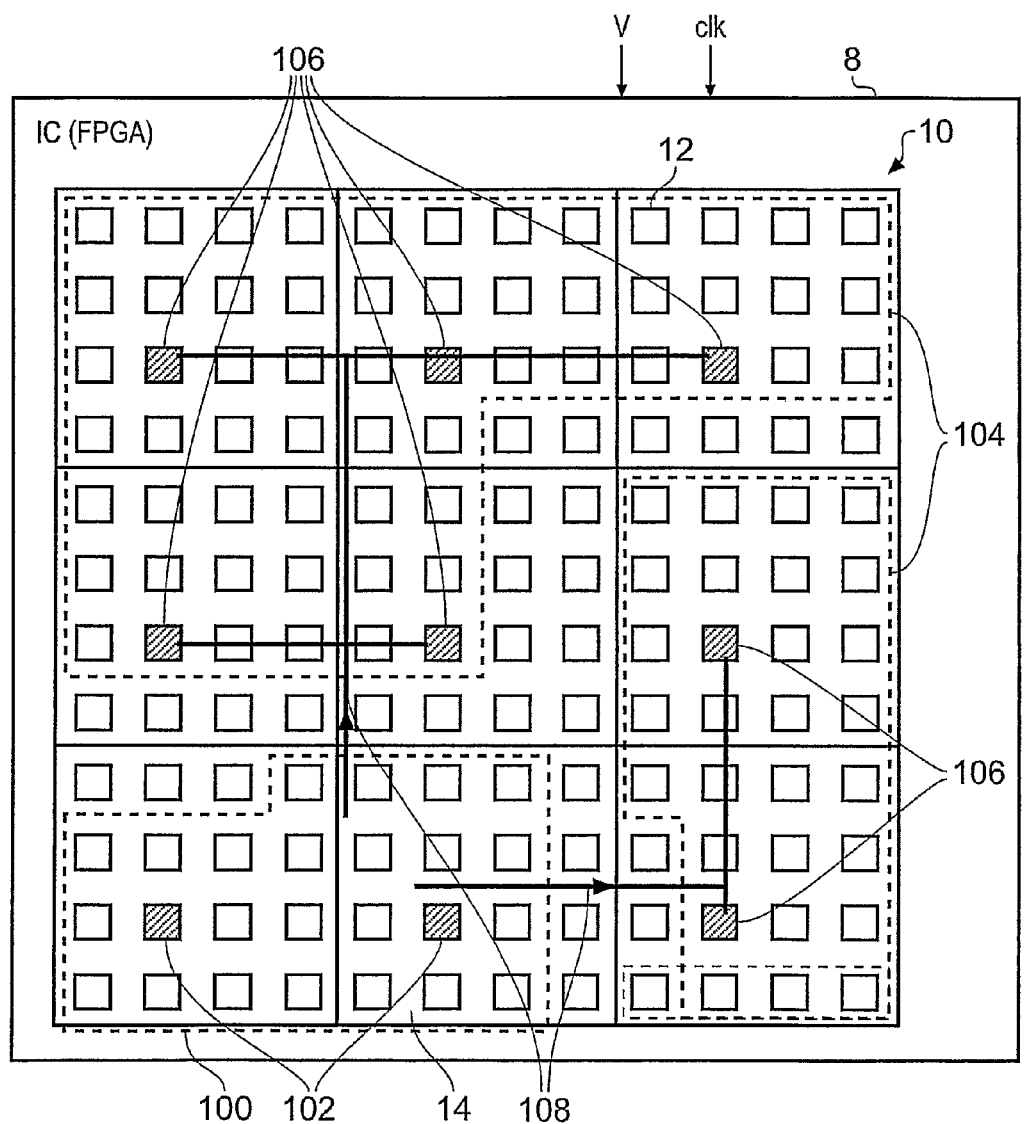
FIG. 3 is an example of the integrated circuit of FIG. 2 in which different functional elements are mapped on to different ones of the powers state regions and may be separately controlled.

FIG. 3 illustrates the integrated circuit 8 of FIG. 2 with different groups of logic elements 12 being used to provide different functionality. In this example the block of logic elements surrounded by a dashed line labelled 100 is used to implement the power controller 14. This power controller 14 remains permanently powered and accordingly the regions containing this power controller will remain permanently powered. Thus, the region controllers labelled 102 will remain permanently enabled so as to supply power to the power controller 14. The dashed lines labelled 104 indicate the perimeter of groups of logic elements 12 used to implement data processing circuits (functionality) that can be selectively switched between power states (e.g. powered-up, powered-down, configuration-retaining, state-retaining etc). The regions containing these circuit groups contain region controllers 106 that are used to power-down and power-up their respective regions. Control signals 108 generated by the power controller 14 are distributed through the array 10 to the appropriate region controllers E and used to control switching of those associated regions between different power states.

It will be appreciated that if a region contains logic elements from multiple groups of logic elements implementing different data processing circuits (functionality), then it will be the highest power requirement between those different groups which controls the power state to be adopted. Thus, the logic elements within a region remain powered if any logic element within that region requires to remain powered. The power controller can be considered to take account of bidding between the logic elements as to their power requirements with the power controller selecting the highest requirement as that which will be satisfied. The regions themselves may perform the bidding operation and act to generate a power requirement signal which is supplied to the power controller and indicates the highest power requirement of any of the logic elements within the region.

Figure 4:
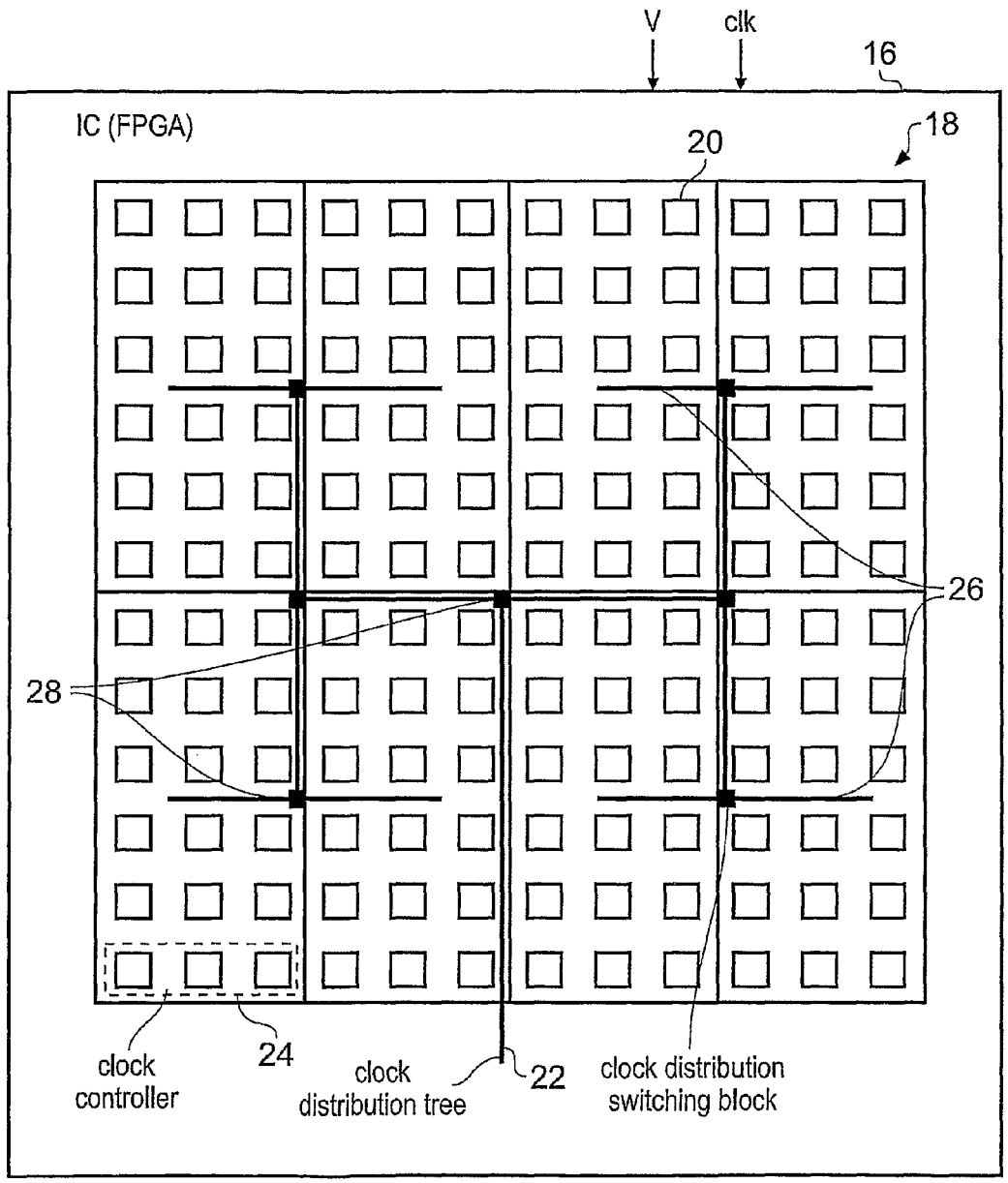
FIG. 4 illustrates an example where a clock distribution tree is controlled on a region-by-region basis.

FIG. 4 schematically illustrates another integrated circuit 16 containing an array 18 of logic elements 20. The clock signal clk is distributed through the clock distribution tree 22 controlled by a power controller in the form of a clock controller 24. The clock distribution tree 22 is divided into a plurality of clock distribution tree branches 26 which supply the clock signal clk to respective regions within the array 18. Region controllers 28 serve to gate the propagation of the clock signal clk through the clock distribution tree 22 so as to selectively pass or block the clock signals clk. Thus, a given region can be switched between being clocked and being unclocked. These different clocking states change the power state of the region concerned. As well as being clocked or unclocked, it is also possible that the region controllers 28 serve to pass a divided-down clock signal with a lower frequency than the clock signal clk supplied to the integrated circuit 16. Clocking a region at a lower frequency will generally reduce its power consumption. The use of a divided-down clock signal also simplifies synchronisation issues since there will remain synchronous edges which can be used for communication between different regions having these different power states corresponding to different clock speeds.

FIG. 5 schematically illustrates how the clock signal clk supplied to the integrated circuit 16 of FIG. 4 may be modified by the region controllers 28 to provide a divided down clock signal having a lower clock frequency. In this example, the region controllers 28, are provided with power control signals from the clock controller 24 to gate the clock signals clk so as to form a corresponding signal having half the frequency or a corresponding signal having one quarter of the frequency. Other frequency division ratios are also possible. The different frequency signals remain synchronised and this eases communication between the different regions which are separately clocked with different frequency clock signals.

FIG. 6 illustrates an example of a logic element 44. This logic element 44 includes a configuration memory 46 storing configuration data for configuring processing circuitry 48 (such as combinational logic circuitry) to perform desired processing operations. Register 52 is provided to hold sequential state and has an associated balloon latch 50. Configurable interconnect circuitry 54 is also associated with the logic element 44 and provides a configurable communication path to other logic elements 44 within an array or to circuits outside of the array, or even outside of the integrated circuit as a whole.

In the example of FIG. 6 it will be seen that the supply voltage Vdd is permanently connected to the configuration memory 46, the balloon latch 50 and the interconnect circuitry 54. However, the processing circuitry 48 and the latch 52 holding sequential circuit state are provided with the supply voltage via a header transistor 56 which is switched off under control of a power control signal from the power controller 14 thus enabling the processing circuitry 48 and the latch 52 to be powered-down. Permanent power to the configuration memory 46 and the balloon latch 50 ensures that the configuration of the logic element 44 is not lost and that the sequential circuit state is also not lost as it is stored to the balloon latch 50 from the latch 52 upon entering the state-retention state and restored from the balloon latch 50 to the latch 52 upon leaving the state-retention state.

In other embodiment it may be that the configuration memory and/or the latch 52 are powered down, but are automatically reloaded with their initial values when the system is powered up. This will also ensure that the configuration and/or state is not lost. The configurable interconnect circuitry 54 remains powered through the operation thereby allowing signals to be communicated via a region in which the processing circuitry 48 within the logic elements 44 is powered down.

FIG. 7 is a flow diagram illustrating how the power state of different regions may be controlled. At step 58 a determination is made in respect of each region as to what is the highest required power state for any logic element within that region. The power state of a region is controlled depending upon the highest requirement of any logic element within that state. When this has been determined at step 58, then step 60 serves to switch the region into a power state corresponding to the currently highest required power state for that region.

The invention claimed is:

1. An integrated circuit comprising:
an array of interconnected configurable processing logic elements, each logic element performing data processing controlled by a configuration stored in said logic element; and
a power controller formed of one or more of said logic elements configured to serve as said power controller and generating one or more power control signals; wherein
said array contains one or more regions each containing one or more of said logic elements;
each region having a corresponding region controller responsive to at least one of said one or more power control signals to switch said one or more logic elements within said region between a plurality of different power states; and
said one or more regions each include said one or more of logic elements and said region controller controls said power state for said one or more logic elements within said region, wherein said power controller is responsive to power state demands of logic elements within a region to generate said one or more power control signals for said region corresponding to all logic elements within said region having a highest power state currently required by any of said logic elements within said region.

2. An integrated circuit as claimed in claim 1, wherein said plurality of different power states include:
a powered state; and
a state-retention state in which a memory within a logic element storing configuration for said logic element and storage circuits storing sequential circuit state for processing performed by said array respectively retain said configuration and said sequential circuit state at least when returning to a powered state and data processing circuits within said logic element are unpowered.

3. An integrated circuit as claimed in claim 2, wherein entry to said state-retention state of a region is triggered by a power control signal generated within said region.

4. An integrated circuit as claimed in claim 2, wherein said data processing circuits that are unpowered in said state-retention state are combinational logic circuits.

5. An integrated circuit as claimed in claim 2, wherein said sequential circuit state is stored to one or more balloon latch circuits upon entering said state-retention state are restored from said one or more balloon latch circuits upon leaving said state-retention state.

6. An integrated circuit as claimed in claim 2, wherein said clock signal input to said array is distributed through said array via a clock tree comprising separate clock tree branches supplying respective ones of said plurality of regions, a region controller for a region serving to gate a clock signal propagating through said clock tree to a clock tree branch of said region to thereby provide different power states.

7. An integrated circuit as claimed in claim 1, wherein said plurality of different power states include at least two of:
an unpowered state;
a configuration-retention state in which a memory within a logic element storing configuration for said logic element retains said configuration at least when returning to a powered state from said configuration-retention state and data processing circuits within said logic element are unpowered;
a powered state;
an unclocked state in which a clock signal input to a logic element is stopped;
a clocked state in which a clock signal input to a logic element is clocked at a full rate of a clock signal input to said array;
a divided-clock state in which a clock signal input to a logic element is clocked at rate divided for a full rate of a clock signal input to said array; and a selected clock state in which a clock signal input to a logic element is clocked with a selected one of a plurality of asynchronous clock signals input to said array.

8. An integrated circuit as claimed in claim 1, wherein said plurality of different power states include a plurality of voltage states, wherein in each of said voltage states said one or more logic elements within a region are supplied with power at a given voltage level.

9. An integrated circuit as claimed in claim 1, wherein said region controller comprises part of one of said one or more logic elements within a region.

10. An integrated circuit as claimed in claim 1, wherein said region controller comprises a region controller macro circuit within a region.

11. An integrated circuit as claimed in claim 1, wherein a region generates a power requirement signal supplied to said power controller corresponding to a highest power state currently required by any of said logic elements within said region.

12. An integrated circuit as claimed in claim 1, wherein different logic elements within at least one region are associated with different functional blocks having separately set power state requirements.

13. An integrated circuit as claimed in claim 1 wherein at least one of said regions comprises configurable interconnect circuitry for routing signal through said region, said configurable interconnect circuitry being formed so as to continue to provide communication through said region irrespective of a current power state of said region.

14. An integrated circuit as claimed in claim 1 wherein at least one of said regions comprises configurable interconnect circuitry for routing signal through said region, said power states including a state in which said configurable interconnect circuitry continues to provide communication through said region and a state in which said configurable interconnect circuitry does not provide communication through said region.

15. An integrated circuit as claimed in claim 1, wherein said region controller comprises:
a switching circuit responsive to a signal input to an associated logic element.

16. An integrated circuit as claimed in claim 1, wherein said array of logic elements form a field programmable gate array.

17. An integrated circuit comprising:
array means of interconnected configurable logic element means, each logic element means performing data processing controlled by a configuration stored in said logic element means; and
power controller means formed of one or more of said logic element means configured to serve as said power controller means and generating one or more power control signals; wherein
said array means contains one or more regions each containing one or more logic element means;
each region having a corresponding region controller means responsive to at least one of said one or more power control signals to switch logic element means within said region between a plurality of different power states; and
said one or more regions each include a plurality of logic element means and said region controller means controls said power state for all of said logic element means within a region, wherein said power controller means is responsive to power state demands of logic element means within a region to generate said one or more power control signals for said region corresponding to all logic element means within said region having a highest power state currently required by any of said logic element means within said region.

18. A method of operating an integrated circuit having an array of interconnected configurable logic elements, each logic element performing data processing controlled by a configuration stored in said logic element, said array containing one or more regions each containing a plurality of logic elements, said method comprising the steps of:
configuring one or more of said logic elements to serve as a power controller;
generating one or more power control signals with said power controller; and
in response to at least one of said one or more power control signals, switching all of said plurality of logic elements within a region between a plurality of different power states, wherein said power controller is responsive to power state demands of logic elements within a region to generate said one or more power control signals for said region corresponding to all logic elements within said region having a highest power state currently required by any of said logic elements within said region.

19. An integrated circuit comprising:
an array of interconnected configurable processing logic elements, each logic element performing data processing controlled by a configuration stored in said logic element; and
a power controller formed of one or more of said logic elements configured to serve as said power controller and generating one or more power control signals; wherein
said array contains one or more regions each containing one or more logic elements;
each region having a corresponding region controller responsive to at least one of said one or more power control signals to switch logic elements within said region between a plurality of different power states; and
wherein said plurality of different power states include:
a powered state; and
a state-retention state in which a memory within a logic element storing configuration for said logic element and storage circuits storing sequential circuit state for processing performed by said array respectively retain said configuration and said sequential circuit state at least when returning to a powered state and data processing circuits within said logic element are unpowered.

20. An integrated circuit comprising:
array means of interconnected configurable logic element means, each logic element means performing data processing controlled by a configuration stored in said logic element means; and
power controller means formed of one or more of said logic element means configured to serve as said power controller means and generating one or more power control signals; wherein
said array means contains one or more regions each containing one or more logic element means;
each region having a corresponding region controller means responsive to at least one of said one or more power control signals to switch logic element means within said region between a plurality of different power states; and
said plurality of different power states include:
a powered state; and
a state-retention state in which a memory within a logic element means storing configuration for said logic element means and storage circuits storing sequential circuit state for processing performed by said array respectively retain said configuration and said sequential circuit state at least when returning to a powered state and data processing circuits within said logic element means are unpowered.

21. A method of operating an integrated circuit having an array of interconnected configurable logic elements, each logic element performing data processing controlled by a configuration stored in said logic element, said array containing one or more regions each containing a plurality of logic elements, said method comprising the steps of:
configuring one or more of said logic elements to serve as a power controller;
generating one or more power control signals with said power controller;
in response to at least one of said one or more power control signals, switching logic elements within a region between a plurality of different power states; and
wherein said plurality of different power states include:
a powered state; and
a state-retention state in which a memory within a logic element storing configuration for said logic element and storage circuits storing sequential circuit state for processing performed by said array respectively retain said configuration and said sequential circuit state at least when returning to a powered state and data processing circuits within said logic element are unpowered.

22. An integrated circuit comprising:
an array of interconnected configurable processing logic elements, each logic element performing data processing controlled by a configuration stored in said logic element; and
a power controller formed of one or more of said logic elements configured to serve as said power controller and generating one or more power control signals; wherein
said array contains one or more regions each containing one or more logic elements;
each region having a corresponding region controller responsive to at least one of said one or more power control signals to switch logic elements within said region between a plurality of different power states; and
wherein said power controller is responsive to power state demands of logic elements within a region to generate said one or more power control signals for said region corresponding to all logic elements within said region having a highest power state currently required by any of said logic elements within said region thereby permitting a plurality of power domains within said region.

23. An integrated circuit comprising:
array means of interconnected configurable logic element means, each logic element means performing data processing controlled by a configuration stored in said logic element means; and
power controller means formed of one or more of said logic element means configured to serve as said power controller means and generating one or more power control signals; wherein
said array means contains one or more regions each containing one or more logic element means;
each region having a corresponding region controller means responsive to at least one of said one or more power control signals to switch logic element means within said region between a plurality of different power states; and
said power controller means is responsive to power state demands of said logic element means within a region to generate said one or more power control signals for said region corresponding to all logic element means within said region having a highest power state currently required by any of said logic element means within said region thereby permitting a plurality of power domains within said region.

24. A method of operating an integrated circuit having an array of interconnected configurable logic elements, each logic element performing data processing controlled by a configuration stored in said logic element, said array containing one or more regions each containing a plurality of logic elements, said method comprising the steps of:
configuring one or more of said logic elements to serve as a power controller;
generating one or more power control signals with said power controller; and
in response to at least one of said one or more power control signals, switching all of said plurality of logic elements within a region between a plurality of different power states, wherein in response to power state demands of logic elements within a region, said step of generating generates said one or more power control signals for said region corresponding to all logic elements within said region having a highest power state currently required by any of said logic elements within said region thereby permitting a plurality of power domains within said region.

* * * * *